United States Patent [19]

Tseng

[11] Patent Number: 5,766,994
[45] Date of Patent: Jun. 16, 1998

[54] DYNAMIC RANDOM ACCESS MEMORY FABRICATION METHOD HAVING STACKED CAPACITORS WITH INCREASED CAPACITANCE

[75] Inventor: Horng-Huei Tseng, Hsinchu, Taiwan

[73] Assignee: Vanguard International Semiconductor Corporation, Hsin-Chu, Taiwan

[21] Appl. No.: 827,816

[22] Filed: Apr. 11, 1997

[51] Int. Cl.[6] .............................................. H01L 21/8242
[52] U.S. Cl. .................................... 438/254; 438/763
[58] Field of Search ........................... 438/253, 254, 438/255, 396, 397, 398, 763, 964, 978

[56] References Cited

U.S. PATENT DOCUMENTS

| | | | |
|---|---|---|---|
| 5,240,871 | 8/1993 | Doan et al. | 438/254 |
| 5,330,928 | 7/1994 | Tseng | 438/254 |
| 5,384,276 | 1/1995 | Ogawa et al. | 438/254 |
| 5,478,769 | 12/1995 | Lim | 438/255 |
| 5,532,182 | 7/1996 | Woo | 438/254 |

*Primary Examiner*—Chandra Chaudhari
*Attorney, Agent, or Firm*—George O. Saile; Stephen B. Ackerman

[57] ABSTRACT

A method for making an array of DRAM cells having increased capacitance was achieved. The method forms a planar insulating layer in which are etched capacitor node contact openings to each FET in an array of cells. A first polysilicon layer is deposited to fill the node contact openings and provide a polysilicon planar surface on the insulating layer. A multilayer of alternate layers of a traditional LPCVD silicon oxide and $O_3$/TEOS silicon oxide is deposited and patterned having openings aligned over the capacitor node contacts where the capacitors are required. The multilayer is then etched in HF to partially etch and recess the faster etching $O_3$/TEOS oxide, forming grooves in the sidewalls of the multilayer structure. A second polysilicon layer is then conformally deposited, etched back and the exposed multilayer structure is selectively removed in HF to leave free-standing bottom electrodes having sidewall spacers and a center pillar that replicate the grooves in the multilayer, thereby providing increased surface area. An interelectrode dielectric layer is formed on the bottom electrodes and a third polysilicon layer is deposited and patterned to form the top electrodes and to complete the array of stacked capacitors on the DRAM device.

22 Claims, 5 Drawing Sheets

DYNAMIC RANDOM ACCESS MEMORY FABRICATION METHOD HAVING STACKED CAPACITORS WITH INCREASED CAPACITANCE

BACKGROUND OF THE INVENTION

(1) Field of the Invention

The present invention relates to integrated circuits built on semiconductor substrates, and more particularly to a method for fabricating dynamic random access memory (DRAM) with stacked capacitors having increased capacitance. The method uses a patterned silicon oxide multilayer structure on which are formed polysilicon capacitor bottom electrodes with increased surface area.

(2) Description of the Prior Art

The circuit density on integrated circuits has continually increased over the years due to innovations in process technologies. One particular device with increased density is the dynamic random access memory (DRAM) which is expected to have more than a billion memory cells (gigabits) by the year 2000 or shortly thereafter. This higher density of memory cells is a result of improved high resolution photolithography and patterning by directional (anisotropic) plasma etching, which result in reduced device sizes. However, this reduction in device size is putting additional demand on the semiconductor processing technologies, and also on maintaining the electrical requirements, such as maintaining or increasing the capacitance of capacitors on DRAM devices.

These DRAM devices consist in part of an array of individual DRAM storage cells that store binary data (bits) as electrical charge on a storage capacitor. Further, the information is stored and retrieved from the storage capacitor by means of a single pass transistor in each memory cell, and by address and read/write circuits on the periphery of the DRAM chip. The pass transistor is usually a field effect transistor (FET) and the single capacitor in each cell is either formed in the semiconductor substrate as a trench capacitor, or built over the FET in the cell area as a stacked capacitor. To maintain a reasonable DRAM chip size and improved circuit performance, it is necessary to further reduce the area occupied by the individual cells on the DRAM chip. Unfortunately, as the cell size decreases, it becomes increasing more difficult to fabricate stacked or trench storage capacitors with sufficient capacitance to store the necessary charge to provide an acceptable signal-to-noise level for the read circuits (sense amplifiers) to detect. The reduced charge also requires increased refresh cycles that periodically restore the charge on these volatile storage cells. This further reduces the performance of the DRAM circuit.

Since the capacitor area is limited to the cell size in order to accommodate the multitude of cells on the DRAM chip, it is necessary to explore alternative methods for increasing the capacitance without increasing the lateral area that the capacitor occupies on the substrate surface. In recent years the method of choice is to build stacked capacitors over the pass transistors within each cell area, rather than forming trench capacitors which are etched in the substrate. This provides increased latitude in capacitor design while reducing cell area. More specifically the stacked capacitors can be built in the vertical extensions (third dimension) to increase the stacked capacitor area and therefore the capacitance.

Numerous methods of making stacked storage capacitors with vertical structures to increase capacitance while increasing the packing density of the cells have been reported in the literature. For example, Woo, in U.S. Pat. No. 5,532,182 teaches a method of forming a stacked capacitor in which a patterned multilayer of alternately doped and undoped amorphous silicon layers is patterned with a photoresist mask to form the bottom electrode for the capacitor having a single sidewall. The sidewall is subjected to an etch to form grooves and thereby increases the capacitor area. Still another approach is taught by Lim in U.S. Pat. No. 5,478,769 in which a multilayer of alternately doped and undoped amorphous silicon layers is patterned using a sidewall spacer mask to provide a vertically extending bottom electrode for the capacitor with two sidewalls. The patterned multilayer is then etched to form grooves that further increase the capacitor area. Another approach is by Doan, U.S. Pat. No. 5,240,871, in which alternate layer of silicon oxide and silicon nitride are patterned and grooves are formed by selectively etching the silicon oxide to provide a structure on which is formed the vertically extending polysilicon bottom electrode having a single grooved sidewall. After forming the interelectrode dielectric and top electrode, the structure is patterned to form the stacked capacitors.

However, to be cost competitive in making DRAMs, it is very desirable to further increase the capacitance by increasing the surface area of the stacked capacitor bottom electrode and memory cell density while simplifying the manufacturing process.

SUMMARY OF THE INVENTION

Therefore a principal object of the present invention is to provide a method for fabricating SRAM with stacked storage capacitors having increased surface areas and therefore increased capacitance.

It is another object of this invention to form the bottom electrodes for these stacked storage capacitors using a removable multilayer silicon oxide structure on which the polysilicon electrode is formed, thereby reducing processing steps and providing a manufacturing cost effective process.

The method for fabricating an array of these dynamic random access memory (DRAM) cells begins by first forming an array of device areas on a semiconductor substrate. Typically the substrate is a single crystal silicon substrate doped with a P-type conductive dopant, such as boron (B). A relatively thick Field OXide (FOX) is formed surrounding and electrically isolating each device area. One method of forming these field oxide areas is by protecting the substrate surface from oxidation where device areas are desired. This is achieved by depositing an oxidation barrier layer, such as a silicon nitride ($Si_3N_4$) layer, and patterning the $Si_3N_4$ leaving portions over the device areas. The exposed field oxide areas on the silicon substrate are then thermally oxidized to form the FOX. This method is typically referred to in the semiconductor industry as the LOCal Oxidation of Silicon (LOCOS) method. After removing the $Si_3N_4$ layer, a thin gate oxide is formed in the device areas on the silicon substrate. A polysilicon layer or polycide (polysilicon/silicide) layer, hereafter referred to as the polycide layer, having a cap oxide ($SiO_2$) thereon is patterned to form the FET gate electrodes and the interconnecting word lines for the DRAM cells. Lightly doped source/drain areas are formed adjacent to the gate electrodes, usually by ion implantation of an N-type dopant such as arsenic (As) or phosphorus (P), and then sidewall spacers are formed on the gate electrode sidewalls, by depositing a conformal insulating ($SiO_2$) layer and anisotropically etching back the layer to the substrate surface. The FETs are then completed by using a second N-type dopant implant to provide heavily doped areas to form the FET source/drain contact areas adjacent to the sidewall spacers.

A first insulating layer, such as silicon oxide, is deposited on the substrate and planarized. For example, the first insulating layer can be globally planarized by chemical/mechanical polishing. A $Si_3N_4$ layer is then deposited on the first insulating layer. Contact openings are then etched in the $Si_3N_4$ layer and first insulating layer to one of the two source/drain contact areas of each FET in the array of memory cells to form node contact openings for the stacked capacitors.

Now by the method of this invention, the stacked capacitors are formed by first depositing an $N^+$ doped first polysilicon layer that makes electrical node contact to the source/drain contact areas in the node contact openings. The $N^+$ doped first polysilicon layer is deposited to a thickness sufficient to fill the node contact openings, thereby forming a planar polysilicon surface since it is deposited on the underlying planar first insulating layer. The portion of the $N^+$ doped first polysilicon layer in the node contact openings forms the low resistant ohmic node contacts for the capacitors.

Continuing, a multilayer made up of two different kinds of silicon oxide is deposited where each alternate layer has a different etch rate in an isotropic etch, such as in a dilute solution of hydrofluoric (HF) acid or by vapor etching in an HF vapor. The multilayer over the first polysilicon layer is patterned by photoresist masking and anisotropic plasma etching to form portions having openings that are aligned over the node contact openings in the silicon nitride layer and in the first insulating layer. For example, one kind of the alternate layers is composed of a silicon oxide deposited by low pressure chemical vapor deposition (LPCVD) using tetraethosiloxane (TEOS) as the reactant gas while the other layers are deposited by thermal CVD using ozone ($O_3$) and TEOS as the reactant gas. The alternate layers deposited by $O_3$ and TEOS have an etch rate that is greater than or equal to 10:1 compared to the alternating layers deposited by LPCVD using only TEOS. When the layers in the multilayer are subjected to isotropic etching, the faster-etching layers form grooves in the sidewalls of the multilayer structure. A conformal second polysilicon layer is deposited on the patterned multilayer and filling the openings in the patterned multilayer structure. The second and first polysilicon layers are anisotropically etched back to the silicon nitride layer, thereby forming polysilicon sidewalls on the patterned multilayer structure while exposing the top surface of the silicon oxide multilayer. An isotropic etch, such as a dilute HF solution, is used to remove the $SiO_2$ multilayer, thereby forming an array of free-standing bottom electrodes for the DRAM stacked storage capacitors. The $Si_3N_4$ layer protects the underlying first insulating layer from etching when the multilayer is removed. After the $SiO_2$ multilayer is removed, the free-standing bottom electrodes replicate the grooves that were in the multilayer thereby providing increased capacitor area. The array of DRAM capacitors is now completed by forming an interelectrode dielectric layer on the bottom electrodes, and then depositing a third polysilicon layer that is patterned to form top electrodes and completes the array of dynamic random access memory cells having stacked storage capacitors with increased capacitance.

BRIEF DESCRIPTION OF THE DRAWINGS

The objects and advantages of this invention are best understood with reference to the attached drawings in FIGS. 1 through 10, and the embodiment that follows.

DESCRIPTION OF THE PREFERRED EMBODIMENT

The DRAM cells having these improved capacitors are typically formed on a P-doped semiconductor substrate using N-channel field effect transistor (N-FET) structures as the pass transistor in each of the DRAM cells. It should also be well understood by one skilled in the art that by including additional process steps, in addition to those described in this embodiment, other types of devices can also be included on the DRAM chip. For example, by forming N-well regions in the P doped substrate, P-channel FETs can also be provided from which Complementary Metal-Oxide-Semiconductor (CMOS) circuits can also be formed, such as are used for the peripheral circuits on the DRAM chip.

Figure 1:
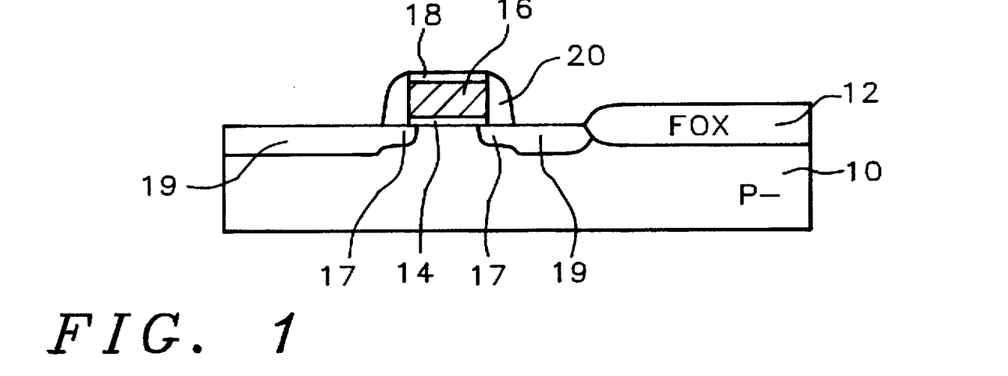
FIGS. 1 through 10 show schematic cross-sectional views for one of the cell regions of an array of DRAM cells illustrating the fabrication steps using a removable silicon oxide multilayer structure for making the stacked storage capacitor with increased surface area.

Referring now to FIG. 1, a schematic cross-sectional view of a portion of a semiconductor substrate 10 is shown having a partially completed DRAM cell with a pass transistor (N-FET) formed on and in the substrate surface. The preferred substrate 10 is composed of a lightly doped P-type single crystal silicon having a <100> crystallographic orientation. A relatively thick Field OXide (FOX) 12 is formed to surround and electrically isolate the individual device regions in which the memory cells are built. The field oxide 12, which is only partially shown in FIG. 1, is most commonly formed by the LOCal Oxidation of Silicon (LOCOS) method. To briefly describe the LOCOS method, a thin silicon oxide (pad oxide) is formed on the substrate, and a thicker silicon nitride ($Si_3N_4$) layer is deposited on the pad oxide and serves as an oxidation barrier layer on the substrate surface (not shown in FIG. 1). Conventional photolithographic techniques and etching are used to remove the barrier layer in areas where a field oxide is required, while retaining the silicon nitride over areas where active devices are to be fabricated. The silicon substrate is then thermally oxidized to form the field oxide areas 12. The field oxide is usually grown to a thickness in the range of between about 3000 and 6000 Angstroms.

The silicon nitride barrier layer and pad oxide are removed in a wet etch. For example, the nitride can be removed in a hot phosphoric acid ($H_3PO_4$) etch at about 180° C., and the pad oxide can be removed in a dilute solution of hydrofluoric acid and water ($HF/H_2O$). The array of pass transistors (N-FETs) is now formed in the active device regions. A thin gate oxide 14 for the N-FETs is formed next in the device areas by thermally oxidizing the active device regions, as shown in FIG. 1. Typically, the thickness of the gate oxide 14 is between about 50 and 150 Angstroms.

Still referring to FIG. 1, the FET gate electrodes in the device areas and the interconnecting word lines on the field oxide 12 are formed next by patterning a polycide layer 16. Preferably the polycide layer 16 is formed by first depositing a polysilicon layer by low pressure chemical vapor deposition (LPCVD) using, for example, a reactant gas such as silane ($SiH_4$), and is typically $N^+$ doped with arsenic or phosphorus to a concentration of between about 1.0 E 19 and 1.0 E 21 atoms/$cm^3$. The polysilicon layer is preferably deposited to a thickness of between about 1000 and 2000 Angstroms. The polycide layer 16 is then completed by depositing a tungsten silicide ($WSi_2$) layer, for example, by CVD using a reactant gas such as tungsten hexafluoride ($WF_6$). Typically, the $WSi_2$ is deposited to a thickness of between about 500 and 1500 Angstroms, providing a polycide layer 16 having a total thickness of between about 1500 and 3500 Angstroms. A cap oxide layer 18, composed of silicon oxide ($SiO_2$), is deposited on layer 16 prior to patterning layer 16 to form the gate electrodes. The cap oxide 18, usually composed of silicon oxide ($SiO_2$), is also deposited using LPCVD by decomposing a reactant gas, such as tetraethosiloxane (TEOS), and is provided over the polycide to electrically insulate the gate electrodes from the bit lines that are formed at a later process step, and is not described in this embodiment. Typically, the thickness of the cap oxide layer 18 is between about 600 and 2000 Angstroms. Conventional photolithographic techniques and anisotropic plasma etching are then used to pattern polycide layer 16 to form the gate electrodes 16, as shown in FIG. 1.

Next, lightly doped source/drain areas 17 are formed adjacent to the gate electrodes 16. The lightly doped source and drain areas 17 for the N-FETs are formed by ion implantation of an N-type dopant, such as arsenic (As) or phosphorus (P). For example, a typical implant might consist of phosphorus $P^{31}$ at a dose of between about 1 E 13 and 1 E 14 atoms/$cm^2$ and at an energy of between about 30 and 80 KeV. The gate electrodes serve as an implant mask to self-align the lightly doped source/drain areas 17 to the gate electrodes, while an additional photoresist mask can be used to avoid unwanted implants elsewhere on the substrate.

After forming the lightly doped source/drain 17, sidewall spacers 20 are formed on the sidewalls of the gate electrode 16, as shown in FIG. 1. Typically the sidewall spacers are formed by depositing a low-temperature silicon oxide, such as TEOS oxide, and anisotropically blanket etching back the oxide to the surface of the substrate 10. For example, the sidewall oxide can be deposited using LPCVD and TEOS at a temperature in the range of about 650° C. to 900° C. The etch back is carried out in a low-pressure reactive ion etcher. An $N^+$ source/drain ion implantation is then used to complete the source/drain areas forming the $N^+$ doped source/drain contact areas 19 aligned to the sidewall spacers 20 and therefore also aligned to the lightly doped source/drain areas 17, as are depicted in FIG. 1. This completes the FET which serves as the switched transistor in each of the memory cell areas.

Figure 2:
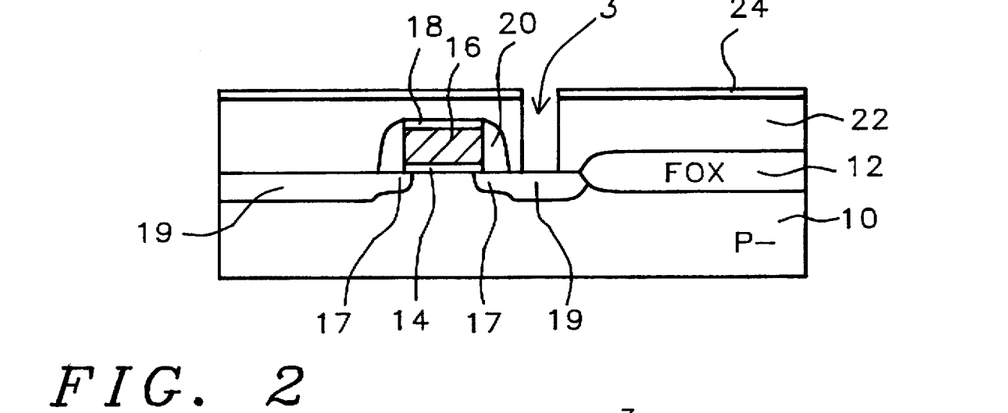

Referring to FIG. 2, a first insulating (or dielectric) layer 22 is deposited using LPCVD or atmospheric pressure chemical vapor deposition (APCVD) and a reactant gas such as TEOS, electrically insulating the underlying FETs including the exposed source/drain contact areas 19. The preferred thickness of layer 22 is between about 3000 and 8000 Angstroms. Layer 22 is then planarized, for example, by chemical/mechanical polishing. A silicon nitride ($Si_3N_4$) layer 24 is then deposited on the first insulating layer 22 that later serves as an etch stop layer. The silicon nitride is preferably deposited by LPCVD, using a reactant gas mixture such as dichlorosilane ($SiCl_2H_2$) and ammonia ($NH_3$), to a thickness of between about 500 and 1500 Angstroms.

Still referring to FIG. 2, node contact openings 3 are etched in the silicon nitride layer 24 and the first insulating layer 22 to one of the two source/drain contact areas 19 of each FET in the array of memory cells where node contacts for the stacked capacitor are desired. Only one DRAM cell area and one node contact opening 3 are shown in FIG. 2. The node contact openings can be etched by using a high-density plasma etcher and a reactant gas mixture such as trifluoromethane ($CHF_3$), oxygen ($O_2$), and a carrier gas such as argon (Ar). Preferably the node contact openings have a width of between about 0.2 and 0.4 micrometers (um).

Figure 3:
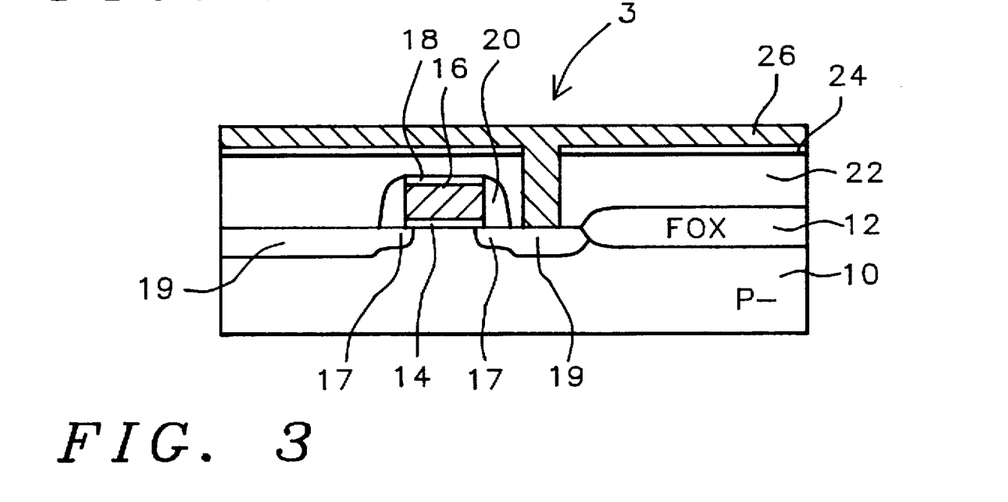

Referring to FIG. 3, the bottom electrodes of the stacked capacitors are now formed by first depositing a relatively thin first polysilicon layer 26. Preferably layer 26 is deposited using LPCVD and a reactant gas such as $SiH_4$. Polysilicon layer 26 is doped with an N-type dopant, such as with phosphorus to a concentration of between about 1.0 E 19 and 1.0 E 21 atoms/$cm^3$. Preferably layer 26 is doped in situ during the LPCVD by adding a dopant gas such as phosphine ($PH_3$). First polysilicon layer 26 is deposited to a thickness sufficient to completely fill the node contact openings 3 resulting in an essentially planar surface on layer 26. For example, the thickness of layer 26 should be at least equal to half the width of the node contact opening 3. For the width of the node contact opening cited above, the preferred thickness of layer 26 is between about 0.1 and 0.2 micrometers (um). The portion of polysilicon layer 26 in the node contact openings 3 forms the node contacts providing good (ohmic) electrical contact to the $N^+$ doped source/drain contact areas 19.

Figure 4:
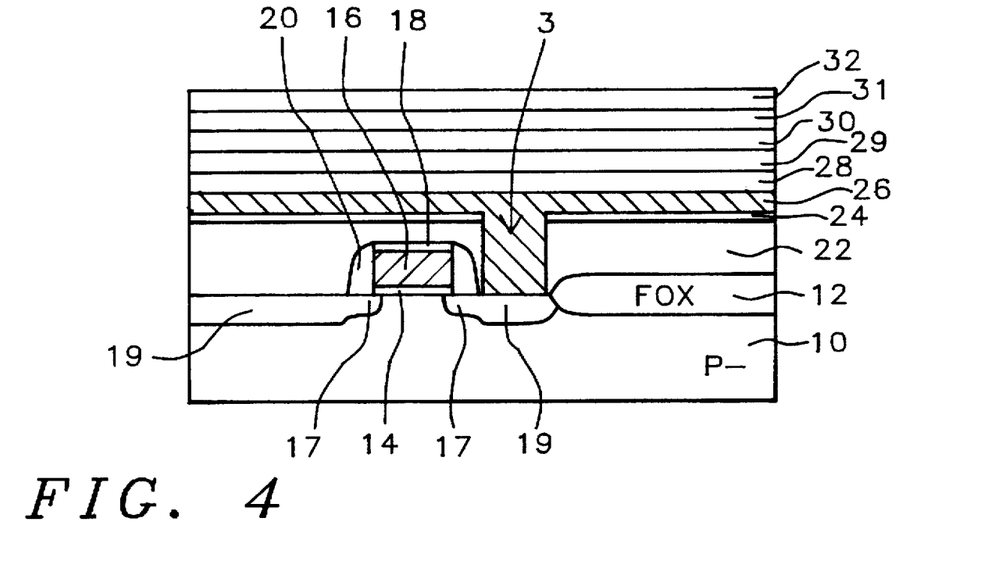

Referring to FIG. 4, a multilayer comprised of two different kinds of silicon oxide is deposited where alternating layers have different etch rates in an isotropic etch such as in a dilute solution of hydrofluoric (HF) acid or by vapor etching in an HF vapor. The invention is described for five alternating layers, although it should it obvious that additional layers can be used to further increase capacitance. The multilayer is preferably composed of one kind of silicon oxide deposited by traditional LPCVD using TEOS for the layers 28, 30, and 32. The alternating layers 29 and 31 are composed of a second kind of silicon oxide deposited by thermal CVD by including ozone ($O_3$) with TEOS during deposition. Both kinds of silicon oxide are deposited to a preferred thickness of between about 200 and 500 Angstroms. The etch rate of layers 29 and 31 deposited with $O_3$ has an etch selectivity of equal to or greater than 10:1 with respect to the etch rate of the conventional LPCVD silicon oxide layers 28, 30, and 32.

Figure 5:
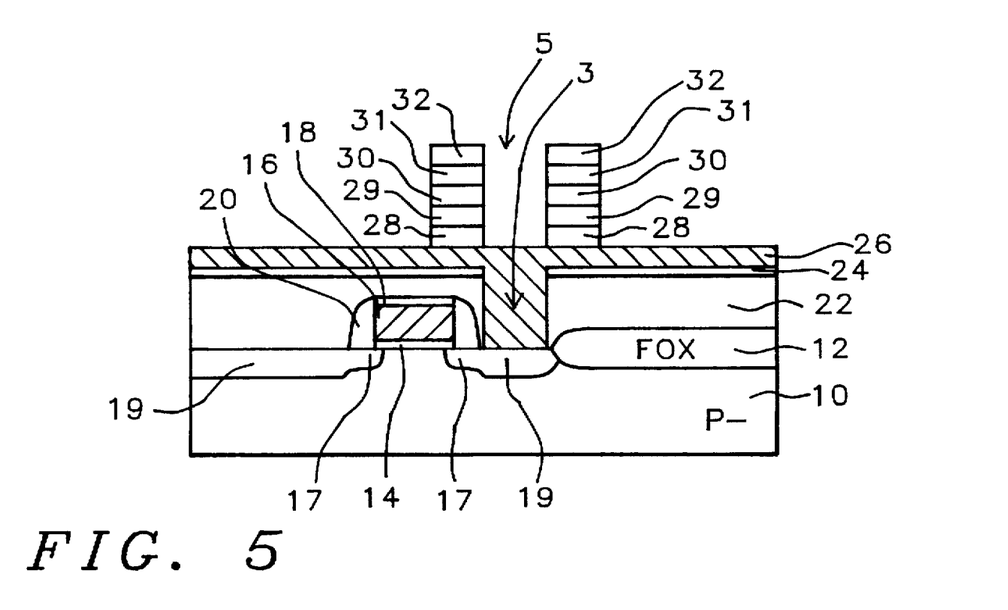

Referring now to FIG. 5, conventional photolithographic techniques providing minimum feature size and anisotropic plasma etching are used to pattern the multilayer over and to the first polysilicon layer 26, leaving portions having openings 5 over each node contact 3. The patterned multilayer has essentially vertical sidewalls and is aligned over the node contact opening 3 in layers 24 and 22.

Figure 6:
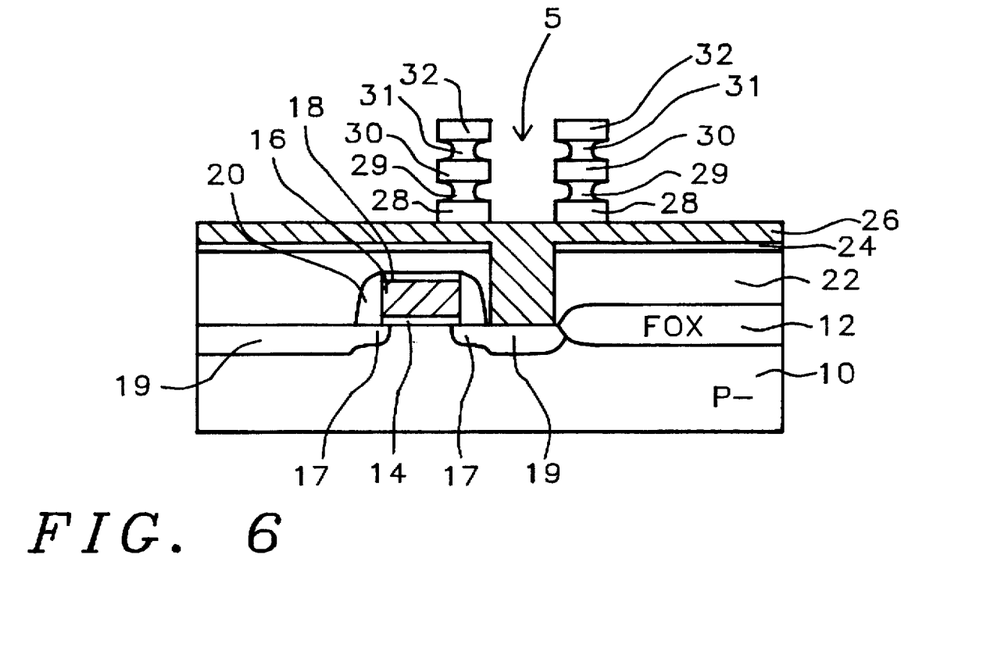

As shown in FIG. 6, the patterned multilayer is subjected to a hydrofluoric (HF) etch to partially recess the silicon oxide layers 29 and 31, which were deposited by $O_3$ and TEOS, and having the higher etch rate. This provides grooves in the sidewalls of the multilayer structure that will later result in increased capacitor area of the bottom electrodes of the stacked capacitor. For example, the recessing of layers 29 and 31 can be achieved by vapor etching using an HF gas.

Figure 7:
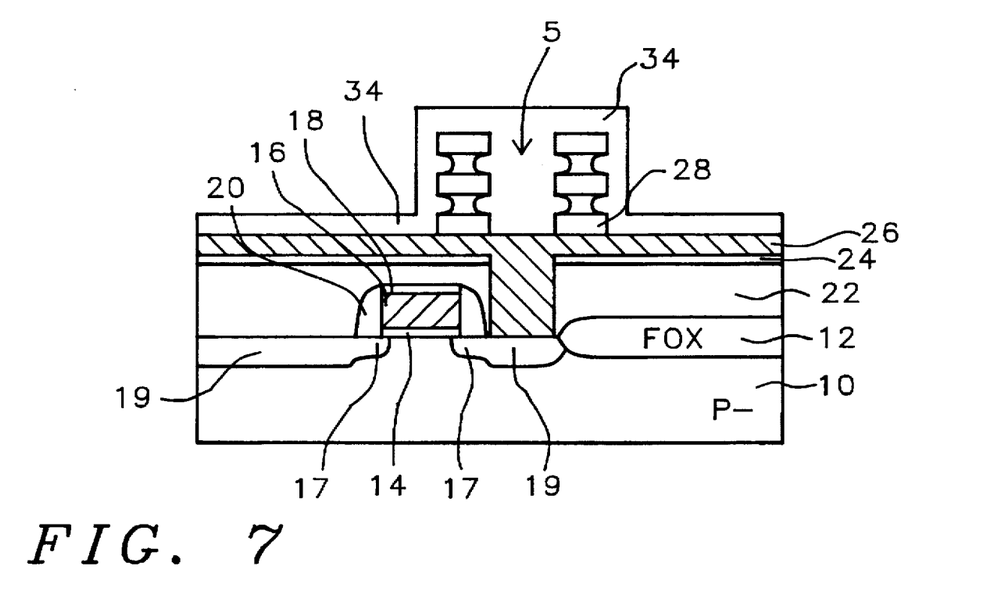

Referring now to FIG. 7, a conformal second polysilicon layer 34 is deposited on the patterned multilayer sufficient to fill the openings 5 in the patterned multilayer structure, more specifically to a thickness of between about 1000 and 3000 Angstroms. Preferably layer 34 is deposited by LPCVD using, for example, $SiH_4$ as the reactant gas. Layer 34 is preferably in-situ doped with an N-type dopant, such as phosphorus, by adding a dopant gas such as phosphine ($PH_3$) during the deposition. The dopant concentration in layer 34 is between about 1.0 E 20 and 1.0 E 21 atoms/$cm^3$.

Figure 8:
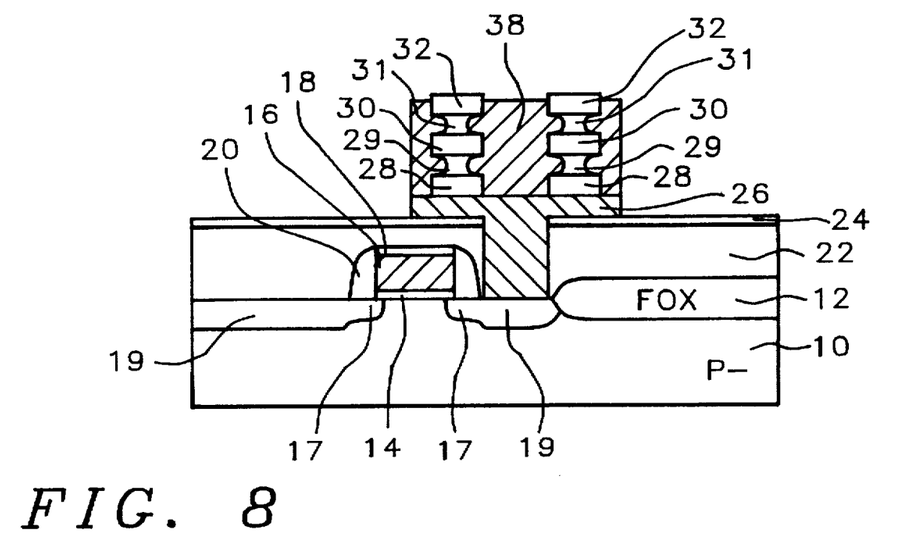

Referring to FIG. 8, the second polysilicon layer 34 (in FIG. 7) and first polysilicon layer 26 are anisotropically etched back to the silicon nitride layer 24, thereby forming polysilicon sidewall spacers 36 and a polysilicon pillar 38 on the patterned multilayer structure while exposing the top surface 32 of the silicon oxide multilayer. The etching can be carried out in a reactive ion etcher using an etchant gas containing chlorine ions.

Figure 9:
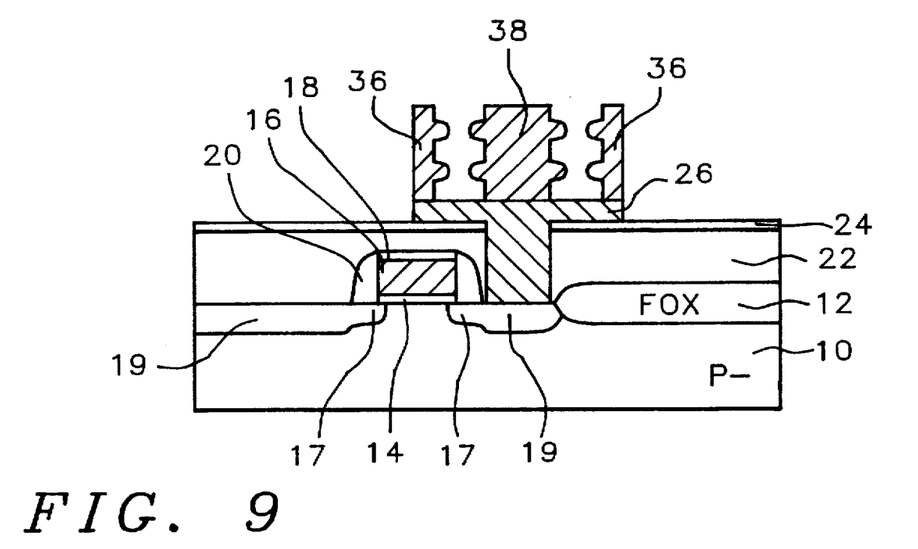

Now referring to FIG. 9, the multilayer composed of the silicon oxide layers 28–32 is now removed using an isotropic etch in a dilute solution of hydrofluoric acid. This provides an array of free-standing bottom electrodes composed of the first polysilicon layer 26, the polysilicon sidewall spacers 36, and the polysilicon pillar 38. During the removal of the silicon oxide multilayer in the HF solution, the $Si_3N_4$ layer 24 protects the underlying first insulating layer 22 from etching. After the $SiO_2$ multilayer is removed, the free-standing bottom electrodes replicate the grooves that were in the multilayer thereby providing increased capacitor area.

Figure 10:
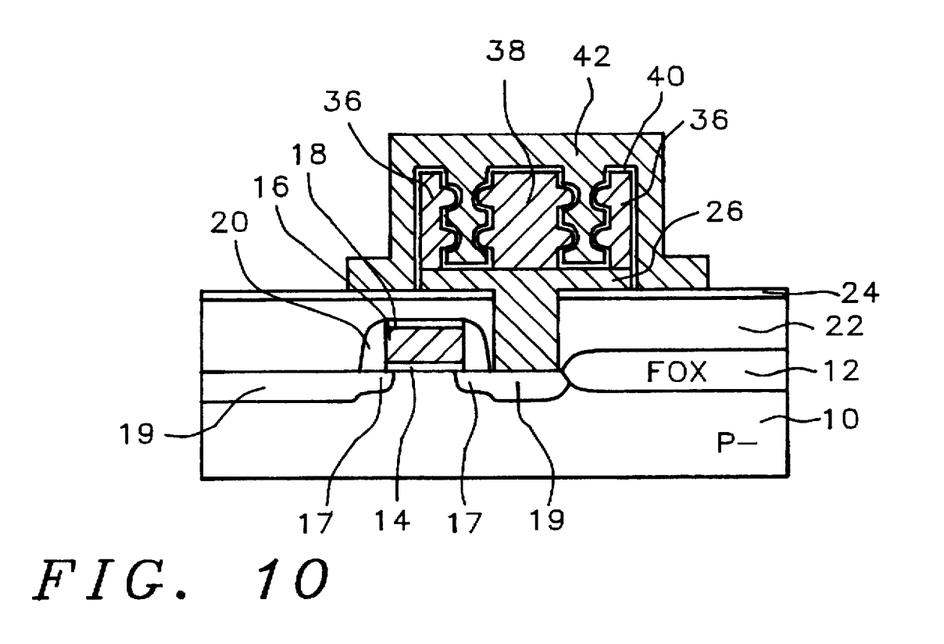

Referring to FIG. 10, the array of DRAM capacitors is now completed by forming an interelectrode dielectric layer 40 on the bottom electrodes composed of polysilicon layer 26, the polysilicon sidewall spacers 36, and the polysilicon pillar 38. The dielectric layer 40 is preferably composed of silicon oxide and silicon nitride (ON). Alternatively, the dielectric can be composed of a multilayer of silicon oxide, silicon nitride, and silicon oxide (ONO). For example, the dielectric layer 40 composed of silicon oxide-silicon nitride-silicon oxide (ONO) is formed by first thermally oxidizing the polysilicon bottom electrode. An LPCVD and a reactive gas mixture of ammonia ($NH_3$) and dichlorosilane ($SiCl_2H_2$) are used to deposit the silicon nitride layer that is then exposed to a wet oxygen, for example, at a temperature of about 850° C. for about 10 minutes to partially convert the silicon nitride to an oxide. The preferred total thickness of the interelectrode dielectric layer 40 is between about 30 and 100 Angstroms. In addition, other commonly practiced methods can be used to further increase the capacitance, such as roughing the electrode surface and by using interelectrode materials having higher dielectric constants, such as tantalum pentoxide ($Ta_2O_5$).

A third polysilicon layer 42 is deposited on the interelectrode dielectric layer 40. Layer 42 conformally covers the bottom electrode and forms the top electrode for the stacked storage capacitors. Layer 42 is preferably deposited by LPCVD and is in-situ doped N-type. The preferred thickness of polysilicon layer 42 is between about 1000 and 2000 Angstroms and is doped with an N-type dopant impurity, such as with phosphorus (P). The preferred concentration of phosphorus in layer 42 is in the range of between about 5.0 E 19 to 1.0 E 21 atoms/cm$^3$. The polysilicon layer 42 is then patterned using conventional photolithographic techniques and plasma etching to form the top electrodes and complete the array of stacked storage capacitors having increased capacitance.

While the invention has been particularly shown and described with reference to the preferred embodiment thereof, it will be understood by those skilled in the art that various changes in form and details may be made without departing from the spirit and scope of the invention.

What is claimed is:

1. A method for fabricating stacked storage capacitors on semiconductor substrates comprising the steps of:

providing said semiconductor substrate having device areas surrounded and electrically isolated from each other by field oxide areas, said device areas having semiconductor devices formed, in part, from a patterned polycide layer, and having device contact areas in said device areas;

depositing a first insulating layer on said device areas and elsewhere on said substrate;

planarizing said first insulating layer;

depositing a silicon nitride layer on said first insulating layer;

etching node contact openings in said silicon nitride layer and said first insulating layer to said device contact areas;

depositing a conformal first polysilicon layer on said silicon nitride layer and filling said node contact openings, thereby forming node contacts for said stacked storage capacitors, said first polysilicon layer having a planar surface;

depositing a multilayer of alternate layers of silicon oxide, said alternate layers having different etch rates in an isotropic etch;

patterning said multilayer over said first polysilicon layer by photoresist masking and anisotropic plasma etching to form portions having openings aligned over said node contact openings in said silicon nitride layer and said first insulating layer;

isotropically partially etching said multilayer and thereby forming grooves in sidewalls of said multilayer;

depositing a conformal second polysilicon layer on said patterned multilayer and filling said openings in said patterned multilayer;

anisotropically plasma etching back said second and first polysilicon layers to said silicon nitride layer, thereby forming polysilicon sidewalls on said patterned multilayer and further exposing the top surface of said multilayer;

selectively removing by isotropic etching said multilayer, thereby forming free-standing bottom electrodes for said stacked storage capacitors;

forming an interelectrode dielectric layer on said bottom electrodes;

depositing a third polysilicon layer;

patterning said third polysilicon layer and forming top electrodes thereby completing said stacked storage capacitors.

2. The method of claim 1, wherein said polycide layer is conductively doped N$^+$ and patterned to form gate electrodes for field effect transistors.

3. The method of claim 1, wherein said first insulating layer is a chemical vapor deposited silicon oxide having a thickness of between about 3000 and 8000 Angstroms.

4. The method of claim 1, wherein said first insulating layer is planarized by chemical/mechanical polishing.

5. The method of claim 1, where said silicon nitride layer is deposited to a thickness of between about 500 and 1500 Angstroms.

6. The method of claim 1, wherein said node contact openings are between about 0.2 and 0.4 micrometers in width.

7. The method of claim 1, wherein said first polysilicon layer is between about 0.1 and 0.2 micrometers (um) thick and is conductively doped N$^+$ with phosphorus (P).

8. The method of claim 1, wherein said multilayer is composed of alternate layers of TEOS LPCVD silicon oxide deposited by low pressure chemical vapor deposition (LPCVD) using tetraethosiloxane (TEOS), and thermal silicon oxide layers deposited by CVD using ozone ($O_3$) and TEOS.

9. The method of claim 8, wherein said thermal silicon oxide formed from ozone ($O_3$) and TEOS etches faster than said LPCVD TEOS silicon oxide, said thermal silicon oxide having an etch selectivity equal to or greater than 10:1 in a dilute solution of hydrofluoric (HF) acid.

10. The method of claim 1, wherein each layer of said multilayer is deposited to a thickness of between about 200 and 500 Angstroms.

11. The method of claim 1, wherein said multilayer is composed of at least five alternating layers.

12. A method for fabricating an array of dynamic random access memory (DRAM) cells having increased capacitance on semiconductor substrates comprising the steps of:

provid­ing said semiconductor substrate having an array of device areas surrounded and electrically isolated from each other by field oxide areas, said device areas having field effect transistors with gate electrodes formed from a patterned polycide layer, and having device contact areas in said device areas;

depositing a first insulating layer on said device areas and elsewhere on said substrate;

planarizing said first insulating layer;

depositing a silicon nitride layer on said first insulating layer;

etching node contact openings in said silicon nitride layer and said first insulating layer to said device contact areas adjacent to said gate electrodes;

depositing a conformal first polysilicon layer on said silicon nitride layer and filling said node contact openings, thereby forming node contacts for said stacked storage capacitors, said first polysilicon layer having a planar surface;

depositing a multilayer of alternate layers of silicon oxide, said alternate layers having different etch rates in an isotropic etch;

patterning said multilayer over said first polysilicon layer by photoresist masking and anisotropic plasma etching to form portions having openings aligned over said node contact openings in said silicon nitride layer and said first insulating layer;

isotropically partially etching said multilayer and thereby forming grooves in sidewalls of said multilayer;

depositing a conformal second polysilicon layer on said patterned multilayer and filling said openings in said patterned multilayer;

anisotropically plasma etching back said second and first polysilicon layers to said silicon nitride layer, thereby forming polysilicon sidewalls on said patterned multilayer and further exposing the top surface of said multilayer;

selectively removing by isotropic etching said multilayer, thereby forming free-standing bottom electrodes for said stacked storage capacitors;

forming an interelectrode dielectric layer on said bottom electrodes;

depositing a third polysilicon layer;

patterning said third polysilicon layer and forming top electrodes thereby completing said array of dynamic random access memory having stacked storage capacitors.

13. The method of claim 12, wherein said polycide layer is conductively doped $N^+$.

14. The method of claim 12, wherein said first insulating layer is a chemical vapor deposited silicon oxide having a thickness of between about 3000 and 8000 Angstroms.

15. The method of claim 12, wherein said first insulating layer is planarized by chemical/mechanical polishing.

16. The method of claim 12, where said silicon nitride layer is deposited to a thickness of between about 500 and 1500 Angstroms.

17. The method of claim 12 wherein said node contact openings are between about 0.2 and 0.4 micrometers in width.

18. The method of claim 12, wherein said first polysilicon layer is between about 0.1 and 0.2 micrometers (um) thick and is conductively doped $N^+$ with phosphorus (P).

19. The method of claim 12, wherein said multilayer is composed of alternate layers of TEOS LPCVD silicon oxide deposited by low pressure chemical vapor deposition (LPCVD) using tetraethosiloxane (TEOS), and thermal silicon oxide layers deposited by CVD using ozone ($O_3$) and TEOS.

20. The method of claim 19, wherein said thermal silicon oxide formed from ozone ($O_3$) and TEOS etches faster than said LPCVD TEOS silicon oxide, said thermal silicon oxide having an etch selectivity equal to or greater than 10:1 in a dilute solution of hydrofluoric (HF) acid.

21. The method of claim 12, wherein each layer of said multilayer is deposited to a thickness of between about 200 and 500 Angstroms.

22. The method of claim 12, wherein said multilayer is composed of at least five alternating layers.

* * * * *